United States Patent [19]
Hidano et al.

[11] Patent Number: 5,506,389
[45] Date of Patent: Apr. 9, 1996

[54] THERMAL PROCESSING FURNACE AND FABRICATION METHOD THEREOF

[75] Inventors: Masaru Hidano, Yokohama; Yasuaki Miura, Hachioji; Osamu Yokokawa, Tsukui, all of Japan

[73] Assignees: Tokyo Electron Kabushiki Kaisha, Tokyo; Tokyo Electron Tohoku Kabushiki Kaisha, Iwate, both, Japan

[21] Appl. No.: 337,366

[22] Filed: Nov. 8, 1994

[30] Foreign Application Priority Data

Nov. 10, 1993 [JP] Japan ................................ 5-305956
Mar. 16, 1994 [JP] Japan ................................ 6-071552

[51] Int. Cl.⁶ .............................. F27B 5/14; F27D 11/00
[52] U.S. Cl. ....................... 219/390; 118/50.1; 118/725
[58] Field of Search ................................. 219/390, 405, 219/411; 118/725, 729, 50.1

[56] References Cited

U.S. PATENT DOCUMENTS

| | | | |
|---|---|---|---|
| 5,095,192 | 3/1992 | McEntire | 219/402 |
| 5,187,771 | 2/1993 | Uchida | 392/416 |
| 5,229,576 | 7/1993 | Nakao et al. | 219/390 |

FOREIGN PATENT DOCUMENTS

| | | |
|---|---|---|
| 60-239371 | 11/1985 | Japan . |
| 60-246582 | 12/1985 | Japan . |
| 63-26985 | 2/1988 | Japan . |

Primary Examiner—Marvin M. Lateef
Assistant Examiner—J. Pelham
Attorney, Agent, or Firm—Beveridge, DeGrandi, Weilacher & Young

[57] ABSTRACT

A thermal processing furnace provided with a helical-shaped heating resistance element along an inner wall surface of a cylindrical insulating member, wherein support members support the heating resistance element that has been divided into a plurality of parts in an axial direction of the insulating member. Each of the support members is formed of a plurality of support pieces that extend in a radially outward direction with respect to the furnace and at a pitch corresponding to that of the heating resistance element, on a base portion positioned on an inner side of the heating resistance element, and tip portions of the support pieces are embedded in the insulating member. Since this enables a simplification of the structure, it is possible to improve the practicability of the process and reduce the fabrication time, with a simple fabrication design, and it is also possible to improve the accuracy of the pitch at which the heating resistance element is arrayed.

20 Claims, 6 Drawing Sheets

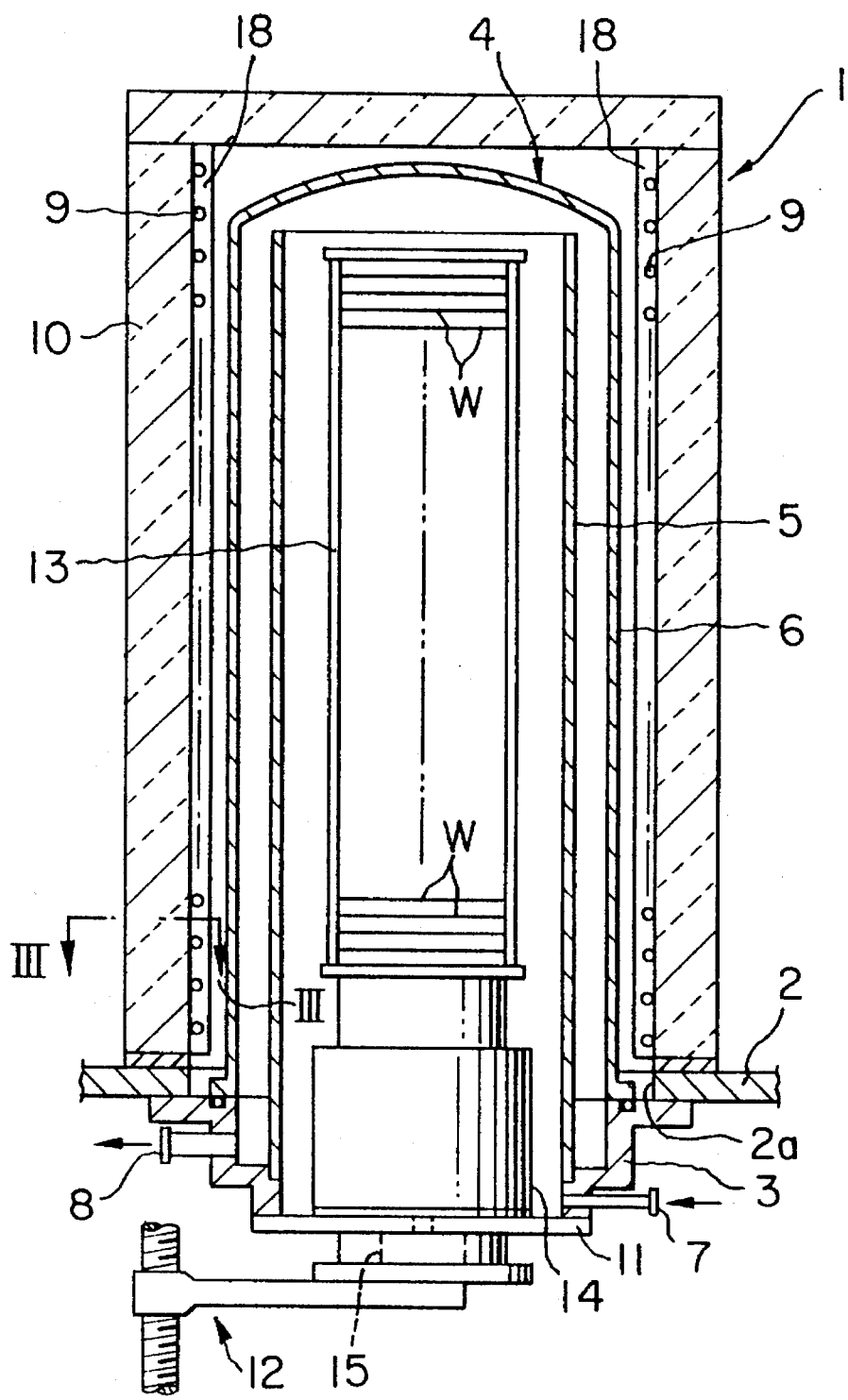
F I G. 1

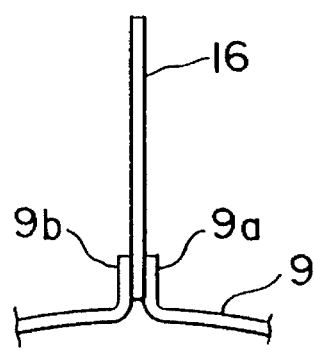
F I G. 8
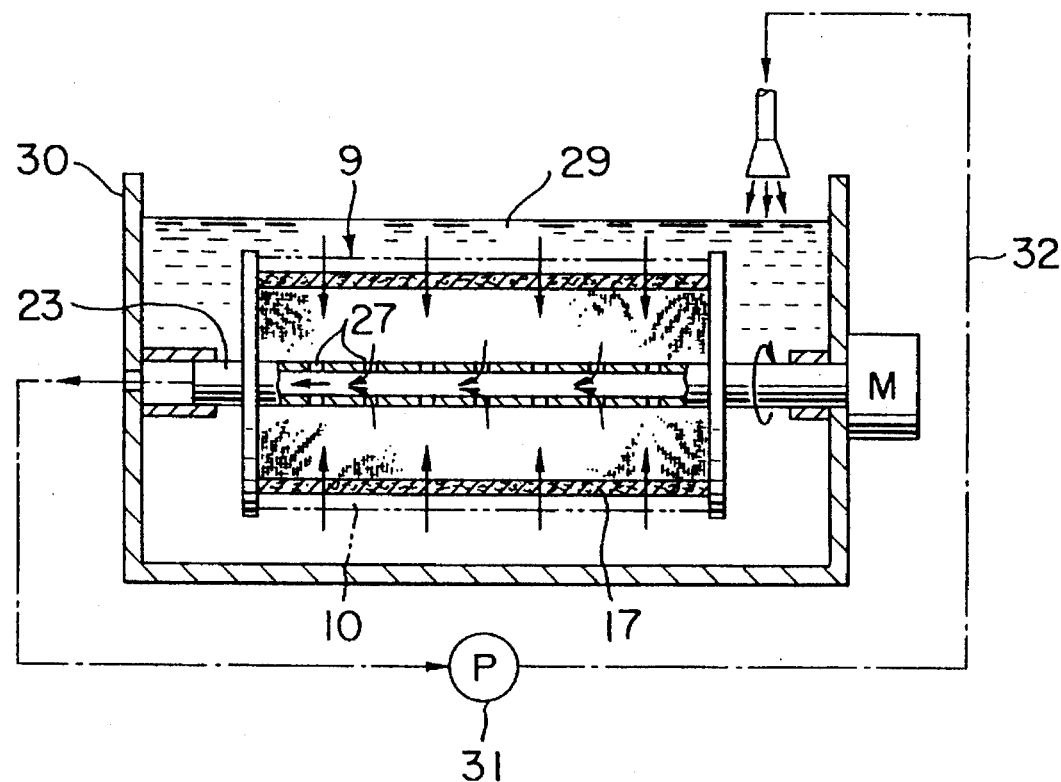
F I G. 9

THERMAL PROCESSING FURNACE AND FABRICATION METHOD THEREOF

BACKGROUND OF THE INVENTION

The present invention relates to a thermal processing furnace and a fabrication method thereof.

During the fabrication of an object to be processed such as a semiconductor wafer, various thermal processing devices are used in order to subject the object to processes such as oxidation, diffusion, or chemical vapor deposition (CVD). In order to enable such processes, an ordinary thermal processing apparatus is configured of a thermal processing furnace that is a process tube forming a processing chamber for accommodating and storing semiconductor wafers, a heater formed of a heating resistance element provided around the periphery of the process tube, and an insulating material provided around the periphery of the heater, wherein the heating resistance element is arranged on an inner wall surface of the insulating material.

The configuration for a thermal processing apparatus that is capable of providing batch processing, for example, is such that a heater wire provided in a helical form along an inner wall surface of a cylindrical insulating member is used as the heating resistance element, and the interior of the thermal processing furnace is heated thereby to a temperature on the order of 1200° C. A material such as ceramic fibers is used as the insulating material, to absorb radiated and conducted heat, greatly reduce the amount of heat required, and thus enable efficient heating.

One method of arranging a heating resistance element in a insulating member is that disclosed in Japanese Patent Laid-Open Publication No. 60-246582. With this fabrication method, a coiled heater wire is used as the heating resistance element, and, after this heater wire has been covered with a thermally shrunk tube and the pitch at which the thermally shrunk heater wire is arrayed has been fixed, a window mold is wound around a columnar core mold and the heater wire is wound over the top of the window mold.

Next, a mold frame that places a lower mold and an upper mold is assembled in the core mold, and an insulating material in slurry form is poured into the mold frame. After the insulating material has been hardened, mold removal, drying, and sintering steps are performed in sequence, and thus an insulating member in which the thermally shrunk tube is embedded can be obtained, in a state in which the heater wire that has melted the thermally shrunk tube is visible through a radiant heat window in the inner wall surface of the insulating member.

However, the above described fabrication method has problems in that a large number of work steps are required (including covering the heater wire with the thermally shrunk tube; winding the window mold and heater wire around the core mold; assembling and removing the mold frame; and hardening, drying, and sintering the insulating member), the process is not very practicable, and a long time is required for the fabrication. Further, when the heater wire is being formed into the helical shape at the predetermined pitch, there are many areas in which the operators are required to be experienced, and thus it is extremely difficult to obtain a good fabrication accuracy.

SUMMARY OF THE INVENTION

An objective of the present invention is to provide a thermal processing furnace and a fabrication method thereof that solves the above described problems, thus not only enabling an improvement in the practicability of the process and a reduction in fabrication time, but also enabling an improvement in the accuracy of the pitch at which the heating resistance element is arrayed.

In order to achieve the above objective, the present invention provides a thermal processing furnace provided with a helical-shaped heating resistance element along an inner wall surface of a cylindrical insulating member, wherein support members support the heating resistance element that has been divided into a plurality of parts in an axial direction of the insulating member. Each of the support members is formed of a plurality of support pieces that extend in a radially outward direction with respect to the furnace and at a pitch corresponding to that of the heating resistance element, on a base portion positioned on an inner side of the heating resistance element, and tip portions of the support pieces are embedded in the insulating member.

In accordance with the present invention, a simple configuration is enabled in which support members (each having a plurality of support pieces that extend in a radially outward direction with respect to the furnace and at a pitch corresponding to that of the helical-shaped heating resistance element in the inner wall surface of the cylindrical insulating member) support the heating resistance element that is arrayed in the axial direction of the insulating member, in a state in which tip portions of the support pieces are embedded in the insulating member. Thus the plurality of support pieces of the support members can accurately set the pitch at which the heating resistance element is arrayed. As a result, it is not only possible to improve the practicability of the process and reduce fabrication time, with a simple configuration, it is also possible to improve the accuracy of the pitch at which the heating resistance element is arrayed. Since the support pieces are not independent of one another and a plurality of these pieces are formed in the base portion of each support member, it is possible to improve the overall strength and prevent deformation, and the heating resistance element can thus be supported safely. Further, thermal expansion and contraction of the heating resistance element in the radial direction of the furnace is permitted between adjacent support pieces.

BRIEF DESCRIPTION OF THE DRAWINGS

FIG. 1 is a lateral cross-sectional view of the entire structure of one embodiment of a thermal processing furnace according to the present invention;

FIG. 5A and FIG. 5B are enlarged perspective views of support members, wherein FIG. 5A shows a support member in which protuberant portions are formed on one side surface and FIG. 5B shows a support member in which protuberant portions are formed on two side surfaces;

FIG. 8 is a partial plan view showing the attachment state of a terminal plate in the heating resistance element of FIG. 7;

FIG. 9 is a schematic view for illustrating the process of accreting an insulating material on filter members during the process of fabricating the thermal processing furnace of the present invention.

DESCRIPTION OF THE PREFERRED EMBODIMENTS

Figure 2:
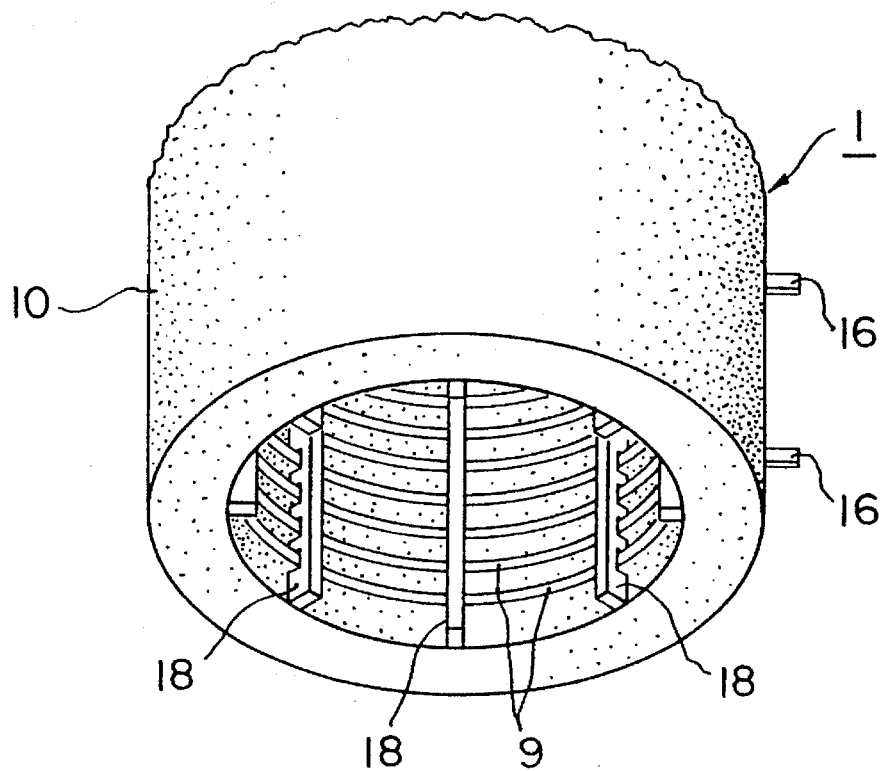
FIG. 2 is a perspective view of part of the thermal processing furnace shown in FIG. 1.

An embodiment of the present invention will be described below with reference to the accompanying drawings.

A lateral cross-sectional view of the entire structure of a thermal processing furnace that is one embodiment of the present invention is shown in FIG. 1. This thermal processing furnace 1 is a vertical furnace configured in such a manner as to be suitable for subjecting semiconductor wafers W that are objects to be processed to film formation processing by reduced-pressure CVD. A base plate 2 formed of a material such as stainless steel and having a circular opening portion 2a in a central portion thereof is provided horizontally.

A short cylindrical manifold 3 of a heat-resistant metal such as stainless steel is attached below the base plate 2 and concentric with the opening portion 2a, in such a manner that it can be attached and removed by bolts, and a cylindrical process tube 4 of a heat-resistant material such as quartz is provided above the manifold 3 to form a processing chamber. In this embodiment, the process tube 4 has a double-walled structure in which an inner tube 5 that is open at upper and lower end portions is arranged concentrically and cylindrically with an outer tube 6 that is closed at an upper end portion. Note, however, that the process tube 4 could comprise an outer tube alone.

In the manifold 3 is provided an inlet port 7 for introducing into the process tube 4 a processing gas from a processing gas supply source that is not shown in the figure, and an outlet port 8 for evacuating the interior of the process tube 4 to a low pressure such as about 10 to $10^{-8}$ Torr, by a pressure-reducing means that is also not shown in the figure. Around the periphery of the process tube 4 is provided a heating resistance element 9 that will be described later, as a heater for heating the interior of the process tube 4 to a temperature of, for example, 800 to 1200° C., and a circular cylindrical insulating member 10 of inorganic fibers. The outer side of the insulating member 10 is covered by an outer shell of a material such as stainless steel, which is not shown in the figure. Note that the insulating member 10 and the outer shell are supported on the base plate 2 in a fixed manner.

Below the manifold 3 is provided a lid 11 that opens and closes a lower surface opening (furnace opening) thereof, which is made of a material such as stainless steel and which is capable of being raised and lowered by an elevator mechanism 12 in such a manner that the opening can be sealed thereby. On this lid 11 is mounted a wafer boat 13 that supports in several stages a large number (such as about 150) of semiconductor wafers W in a horizontal state, spaced apart in the vertical direction, with an insulating tube 14 therebetween. Note that means such as a rotational mechanism 15 that drives the insulating tube 14 in a rotational manner about the center of a shaft is also provided in the lid 11.

The heating resistance element 9 is formed of kanthal wire that is a wire of an alloy of, for example, iron (Fe), chrome (Cr), and aluminum (Al). The thickness thereof depends on the use to which the thermal processing furnace 1 is put, but in this embodiment a wire of a diameter of about 3.5 mm is used. The heating resistance element 9 is, as shown in FIG. 2, formed in a helical shape at a predetermined pitch along the inner wall surface of the insulating member 10. Terminal plates 16 are provided in the helical-shaped heating resistance element 9 at suitable spacing in the axial direction of the insulating member 10, to provide electrode connections protruding outward through the insulating member 10, to form a configuration in which the interior of the thermal processing furnace 1 is divided into a plurality of heating zones in the vertical direction so that temperature control can be provided. These terminal plates 16 are of the same material as the heating resistance element 9 and are formed to have a cross-section that is determined to be suitable from considerations of preventing them from melting and suppressing the amount of heat radiated therefrom.

The terminal plates 16 are arranged in such a manner that plate surfaces thereof are aligned along the axial direction of the insulating member 10. This ensures that, when filter members 17 (see FIG. 6) that are provided between the heating resistance element 9 and the insulating member 10 during the fabrication process (which will be described later) are removed, the filter members 17 can be removed easily without pulling out the terminal plates 16. In order to enable this configuration, the heating resistance element 9 is cut in an intermediate portion thereof at an attachment portion for the terminal plate 16 as shown in, for example, FIG. 7 and FIG. 8, the two cut ends thereof 9a and 9b are bent outward in a radial direction with respect to the furnace, and the two surfaces at one end of a terminal plate 16 are sandwiched between these two bent cut ends 9a and 9b and are fixed thereto by means such as welding.

Figure 3:
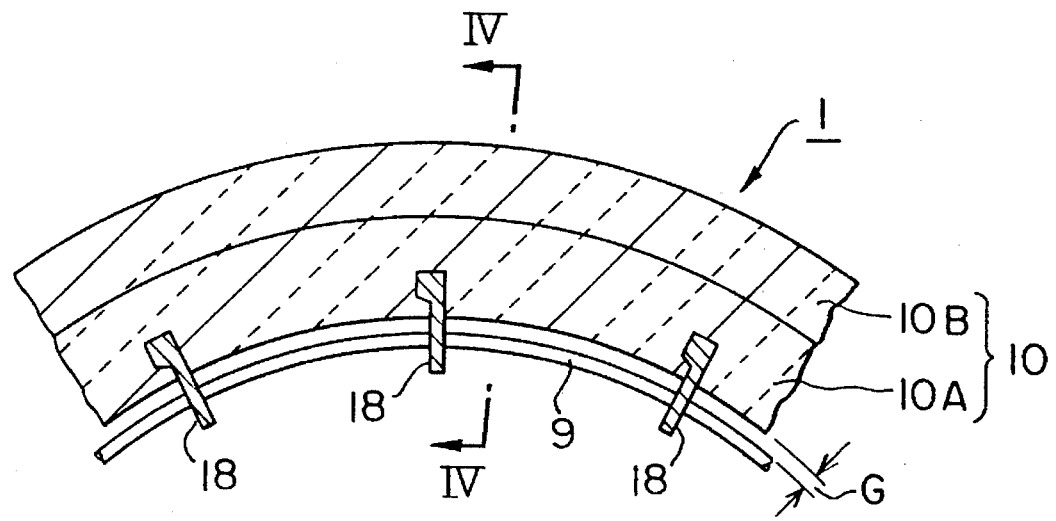
FIG. 3 is an enlarged cross-sectional view of the thermal processing furnace of FIG. 1, taken along the line III—III of FIG. 1.
Figure 4:
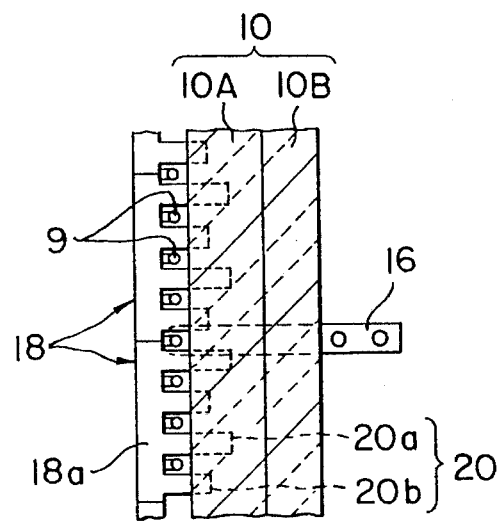
FIG. 4 is a cross-sectional view of the thermal processing furnace of FIG. 1, taken along the line IV—IV of FIG. 3.
Figure 5A:
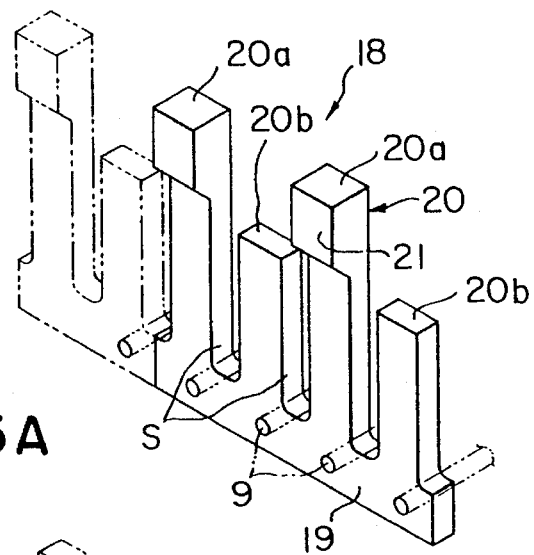

The heating resistance element 9 is attached to the inner wall surface of the insulating member 10 by a support assembly or support means that includes groups of support members 18 which, as shown in FIG. 2, are spaced about the periphery of the inner wall of insulating member 10. Support members 18 are formed of a material that has thermal resistance and electrical resistance, such as a ceramic, at a requisite gap G away from that wall surface, in a state such that the pitch at which it is arrayed can ensure the requisite heat quantity, as shown in FIG. 2 to FIG. 4. Each group of support members 18 is comprised of a plurality of support members arranged in the axial direction of the insulating member 10. Each support member 18 is configured in a comb-shaped form in which a plurality of support pieces 20 (in this embodiment there are four) extend in a radially outward direction from the furnace at a pitch that corresponds to that of the heating resistance element 9, from a base portion 19 positioned on the inner side of the heating resistance element 9, as shown in FIG. 5.

Figure 5B:
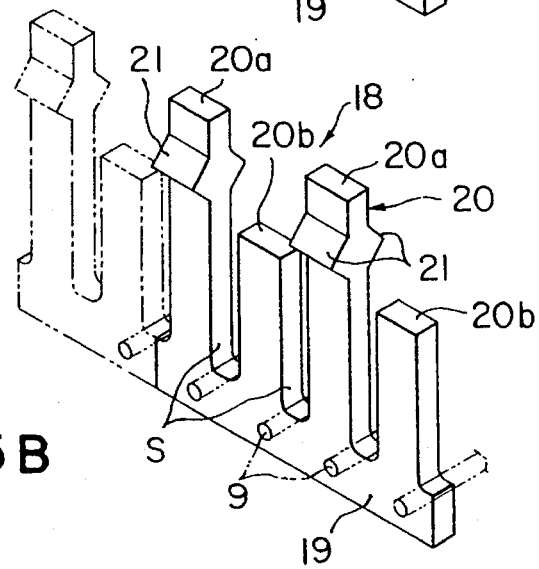

A tip end portion of each of the support pieces 20 is embedded into the insulating member 10 during the fabrication process, so that it is supported thereby, but, in this case, the lengths of the longer support pieces 20 are formed as suitable in order to ensure a certain degree of support. In this embodiment, the configuration is such that adjacent support pieces 20 have different lengths, with longer support pieces 20a alternating with shorter support pieces 20b, and with slit-shaped spaces S being provided between adjacent support pieces 20a and 20b to accommodate the heating resistance element 9. A protuberant portion 21 for preventing removal from the insulating member 10 after being embedded therein is formed at a tip portion of each of the longer support pieces 20a. This protuberant portion 21 is formed in one side surface of the support piece 20a to facilitate removal from a mold during fabrication, but protuberant portions 21 could equally well be formed in both side surfaces thereof, as shown in FIG. 5B.

The support members 18 formed in this manner are arranged in lines in the axial direction of the insulating member 10 with the tip portions of the support pieces 20 embedded in the insulating member 10, and are also arranged in the peripheral direction thereof at a predetermined uniform spacing, such as an angular spacing of about 30 degrees. Note that if a sufficient degree of support of the support pieces 20 could be obtained from the insulating member 10, the lengths of the support pieces 20a and 20b could be made the same, and also the protuberant portions 21 need not be provided.

In accordance with the thermal processing furnace 1 configured as described above, a simple configuration is enabled in which support members 18 (each having a plurality of support pieces 20 that extend in a radially outward direction with respect to the furnace and at a pitch corresponding to that of the helical-shaped heating resistance element 9 in the inner wall surface of the cylindrical insulating member 10) support the heating resistance element 9 that is arrayed in the axial direction of the insulating member 10, in a state in which tip portions of the support pieces 20 are embedded in the insulating member 10. Thus the plurality of support pieces 20 of the support members 18 can accurately set the pitch at which the heating resistance element 9 is arrayed. As a result, it is not only possible to improve the practicability of the process and reduce fabrication time, with a simple configuration, it is also possible to improve the accuracy of the pitch at which the heating resistance element is arrayed.

Since the support pieces 20 are not independent of one another and a plurality of these pieces are formed in the base portion 19 of each support member 18, it is possible to improve the overall strength and prevent deformation, and thus the heating resistance element 9 can be supported safely. Further, since slit-shaped spaces S are formed between adjacent support pieces 20 and a gap G is formed between the heating resistance element 9 and the inner wall surface of the insulating member 10, as shown in FIG. 3, thermal expansion and contraction of the heating resistance element 9 in the radial direction of the furnace is permitted.

Since the plate surfaces of the terminal plates 16 provided for the heating resistance element 9 are arranged in the axial direction of the insulating member 10, the filter members 17 that are interposed between the heating resistance element 9 and the insulating member 10 in the fabrication process does not pull on the terminal plates 16 during the removal of the filter members 17 from the axial direction of the insulating member 10, so that the filter members 17 can be removed easily, thus improving the practicability of the process further.

Figure 10:
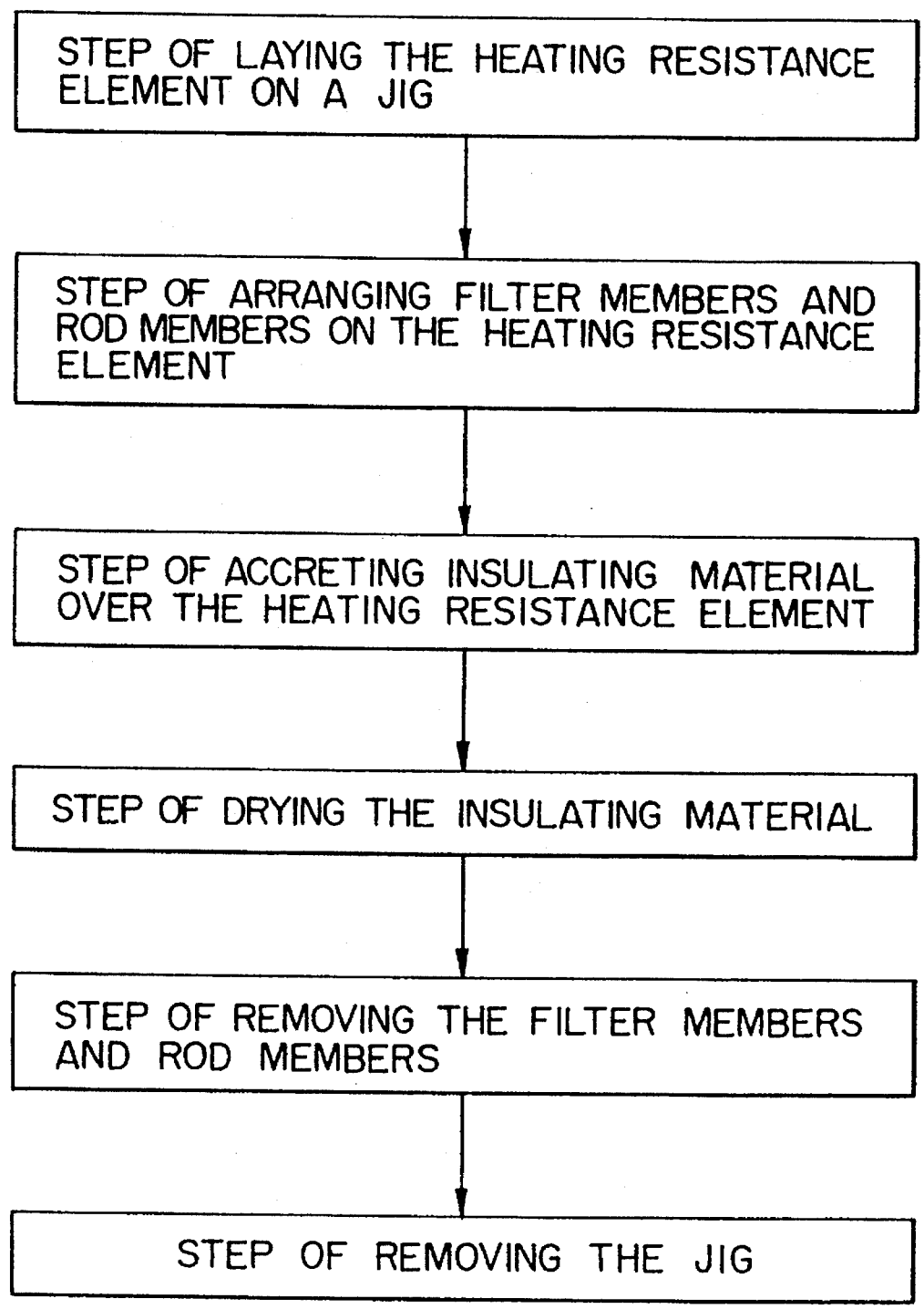
FIG. 10 is a flowchart for illustrating the steps in the method of fabricating the thermal processing furnace of the present invention.

The method of fabricating the thermal processing furnace 1 of the above configuration will now be described. This fabrication method consists of the following steps: (1) laying the heating resistance element on a jig, (2) arranging filter members and rod members on the heating resistance element, (3) accreting insulating material over the heating resistance element, (4) drying the insulating material, (5) removing the filter members and rod members, and (6) removing the jig (see FIG. 10). These steps are each described below.

(1) Laying the Heating Resistance Element on a Jig

Figure 6:
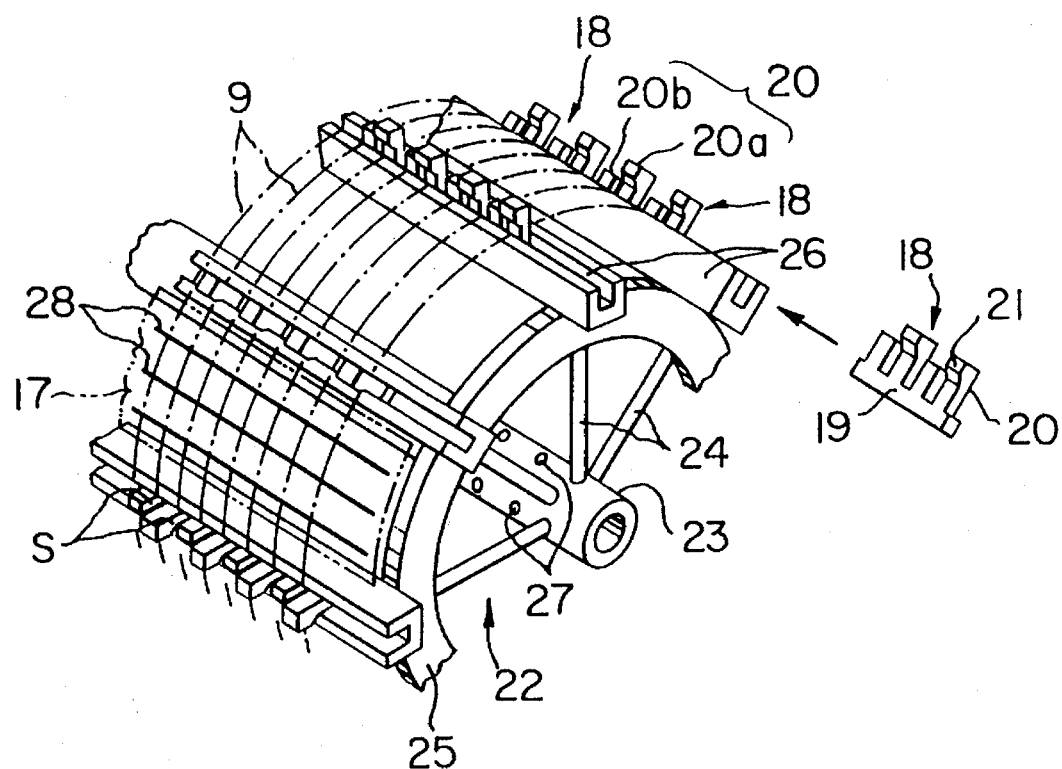
FIG. 6 is a perspective view for illustrating the configuration of a jig used in the fabrication of a thermal processing furnace to which the present invention is applied.
Figure 7:
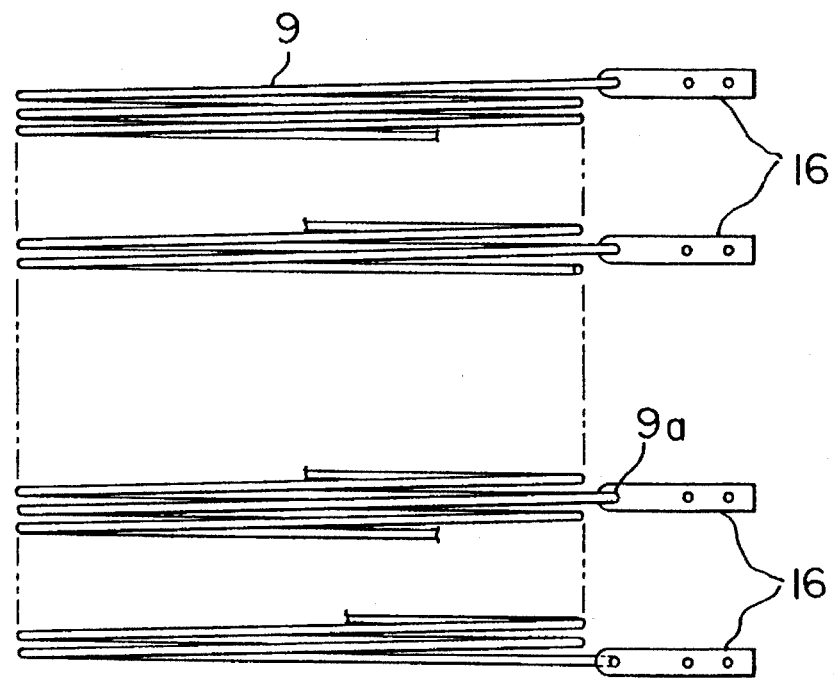
FIG. 7 is a side view of a heating resistance element having terminal plates of the thermal processing furnace of the present invention.

The heating resistance element 9 and a jig 22 are first prepared. The helical-shaped heating resistance element 9 has terminal plates 16 at a suitable spacing in the axial direction on an outer side thereof, with plate surfaces thereof arranged along the axial direction, as shown in FIG. 7 and FIG. 8. On the jig 22 is arrayed in the axial direction thereof the support members 18, each formed of a plurality of support pieces 20 (20a and 20b) extending in a radially outward direction at a pitch corresponding to that of the heating resistance element 9 from the base portion 19 that is positioned on the inner side of the heating resistance element 9, wherein those support members 18 are positioned at predetermined positions in the peripheral direction of the heating resistance element 9, as shown in FIG. 6.

This jig 22 is provided with annular base plates 25 at suitable spacing along the axial direction of a hollow shaft 23 with radial spokes 24 therebetween, and a drum shape is formed by using grooves provided radially in the base plate 25 to support channel-shaped guide members 26 which open outward from the outer periphery of the base plates 25 to bridge between the base plates 25 radially and which are also arranging at uniform spacing in the peripheral direction. A plurality of support members 18 are attached together in lines within the guide members 26 of the jig 22. A plurality of suction holes 27 are provided in the periphery of the hollow shaft 23. Means such as spacers are provided in back portions of the guide members 26 to enable positional adjustment in the radial direction, and these can be fixed by means such as bolts.

The helical-shaped heating resistance element 9 is then strung in a helical manner into the spaces S between the support pieces 20 of the support members 18, starting from one end of the jig 22 of the above configuration, while the jig 22 is rotated.

(2) Arranging Filter Members and Rod Members on the Heating Resistance Element

The filter members 17 are arranged around the outer periphery of the heating resistance element 9, avoiding the terminal plates 16 and the support pieces 20 of the support members 18, and then narrow-diameter rod members 28 are arranged along the axial direction of the heating resistance element 9, over the filter members 17, at a suitable spacing in the peripheral direction. A fine aluminum mesh or the like is suitable as the filter members 17 and round bars of stainless steel of a diameter of 1 to 2 mm or the like are suitable as the rod members 28. The filter members 17 are arranged such that they avoid the support pieces 20 and the terminal plates 16 but otherwise cover the entire outer peripheral surface of the heating resistance element 9, and are of a predetermined thickness to ensure that they can be removed from the axial direction. The rod members 28 are arranged above the filter members 17 and fixed thereto by string or rubber bands.

(3) Accreting Insulating Material Over the Heating Resistance Element

The heating resistance element 9 is immersed in a suspension 29 comprising inorganic fibers that are to form an insulating material, as shown in FIG. 9, and the insulating material is made to accrete on the filter members 17 by the application of suction from the inner side of the heating resistance element 9. In this case, the heating resistance element 9 is immersed into a suspension tank 30 together with the jig 22 in a state in which the two axial end portions of the jig 22 within the heating resistance element 9 are sealed, as shown in FIG. 9. A slurry of inorganic fibers such as silica, alumina, or aluminum silicate fibers mixed with water and a binder is used as the suspension 29.

If the pressure within the heating resistance element 9 is reduced through the suction holes 27 of the shaft 23 by connecting a suction pump 31 to the hollow shaft 23 of the jig 22, the suspension 29 is drawn against the surface of the filter members 17 so that the fibrous component thereof, which is an insulating material that does not pass through the filter members 17, is made to accrete on the filter members 17. Note that the water and such of the fibrous component that does pass through the filter members 17 is collected through an exhaust pipe 32 of the suction pump 31, but it could be recycled back into the suspension tank 30.

Note also that, in this case, the suspension 29 could be agitated within the suspension tank 30 and also the insulating material could be made to accrete to a uniform thickness on the filter members 17 by causing the jig 22 to rotate about the shaft 23 by means of a motor M. By causing the insulating material to accrete on the filter members 17 in this manner, the insulating member 10 of a predetermined thickness is formed and the tip portions of the support pieces 20 of the support members 18 are embedded in the insulating member 10.

In this step, it is possible to form an insulating member 10 of double-layer configuration comprising an inner high-density layer 10A and an outer low-density layer 10B, as shown in FIG. 3, or even form it of a multi-layer configuration, by varying the density of the suspension 29. However, it should be obvious to those skilled in the art that a single-layer configuration is equally possible. In this embodiment, the high-density layer 10A of the insulating member 10 is intended to increase the degree of support of the support pieces 20 and the low-density layer 10B thereof is intended to increase the insulation whilst restraining any further increase in the overall weight.

(4) Drying of Insulating Material

Once the insulating member 10 of a predetermined thickness has been formed on the filter members 17 in the previous step, it is removed together with the jig 22 from the suspension tank 30, and the insulating material accreted on the filter members 17 is dried either naturally or forcibly. Thus a cylindrical insulating member 10 is obtained.

(5) Removal of Filter Members and Rod Members

After the drying, the rod members 28 are pulled out in the axial direction from between the insulating member 10 and the filter members 17, and then the filter members 17 are removed from between the insulating member 10 and the heating resistance element 9. Since the rod members 28 are of a narrow diameter and thus the contact surfaces thereof with the insulating member 10 are small, they can be removed easily and, since a certain amount of space is created between the insulating member 10 and the filter members 17 by the removal of the rod members 28, the filter members 17 can be removed comparatively easily. This removal of the filter members 17 forms the gap G (equivalent to the total thickness of the filter members 17 and the rod members 28) between the insulating member 10 and the heating resistance element 9, and this gap G can allow deformation in radially outward directions due to thermal expansion.

(6) Removal of Jig

In this step, the jig 22 is removed from the support members 18 by pulling out the jig 22 that is supporting the support members 18 from the axial direction of the insulating member 10. By means such as surface processing of the insulating member 10, the thermal processing furnace 1 is obtained wherein the heating resistance element 9 is attached to the inner wall surface of the cylindrical insulating member 10, with the support members 18 therebetween.

With the method of fabricating the thermal processing furnace 1 comprising the above steps, the heating resistance element 9 is first formed into a helical shape, and a jig 22 is used to array in the axial direction thereof the support members 18, each formed of a plurality of support pieces 20 extending in a radially outward direction at a pitch corresponding to that of the heating resistance element 9 from the base portion 19 that is positioned on the inner side of the heating resistance element 9, wherein those support members 18 are positioned at predetermined positions in the peripheral direction of the heating resistance element 9. The heating resistance element 9 is attached over the support members 18 onto the jig 22 while the jig 22 is rotated, so that the prior art step of winding the heating resistance element 9 into a helical shape is omitted. Moreover, the pitch at which the heating resistance element 9 is arrayed is automatically set by the plurality of support pieces 20 of the support members 18, so that the work involved in arraying the heating resistance element 9 can also be omitted and also control over the array pitch is improved.

When the insulating member 10 is provided on the outer side of the heating resistance element 9 in accordance with the present invention, the insulating material can be made to accrete on the outer side of the heating resistance element 9 with the filter members 17 therebetween by simply immersing the heating resistance element 9 in the suspension 29 and applying suction from the inside thereof, so that the insulating member 10 can be formed on the outer side of the heating resistance element 9 thereby and thus there is no need to assemble and remove a mold frame. Moreover, the insulating member 10 can simply be dried, making the sintering step unnecessary, so that the insulating member 10 can be formed in a short time. After the insulating member 10 is formed, when the filter members 17 interposed between the heating resistance element 9 and the insulating member 10 are to be removed, a space can be formed between the filter members 17 and the insulating member 10 by removing the rod members 28 interposed between the filter members 17 and the insulating member 10. Since the plate surfaces of the terminal plates 16 are arrayed in the axial direction of the insulating member 10, it is difficult for the filter members 17 to pull out the terminal plates 16, and thus the filter members 17 can be removed easily from the insulating member 10. When the thermal processing furnace 1 it is not only possible to improve the practicability of the process and reduce fabrication time, with a simple configuration, it is also possible to improve the accuracy of the pitch at which the heating resistance element is arrayed.

Note that the present invention is not limited to the embodiment described herein; it can of course be varied within the scope of the claims thereof. For example, when the insulating member 10 has a two-layer configuration as in the above described embodiment, a mesh member of a material such as aluminum could be interposed between the high-density layer 10A and low-density layer 10B thereof, with the intention of improving the reflection of radiant heat from the heating resistance element 9, and improving the strength of the insulating member 10. Similarly, in order to reflect radiant heat directed from the heating resistance element 9 to the insulating member, cross members of a material such as silica could be provided extending along the inner wall surface of the insulating member 10.

Further, the objects to be processed that are subjected to thermal processing in the thermal processing furnace to which the present invention is applied are not limited to surface objects; the present invention can be applied to objects such as LCD substrates as well as the semiconductor wafers W. Similarly, the thermal processing furnace to which the present invention is applied could be a furnace used for processes such as oxidation, diffusion, or annealing, as well as reduced-pressure CVD.

What is claimed is:

1. A thermal processing furnace provided with a helical-shaped heating resistance element along an inner wall surface of a cylindrical insulating member, said thermal processing furnace comprises supporting means for supporting said heating resistance element said supporting means being comprised of a plurality of support members arranged in a vertical axial direction of said insulating member, each of said supporting members is formed to have, on a base portion positioned on an inner side of said heating resistance element, a plurality of support pieces extending off the base portion in a radially outward direction with respect to said thermal processing furnace at a pitch corresponding to that of said heating resistance element, and tip portions of said support pieces are embedded in said insulating member, and said tip portions representing free ends of said support pieces and said support pieces extending off from said base portion such that adjacent support pieces and said base portion define an open slot and said heating resistance element being positioned within said open slot.

2. The thermal processing furnace according to claim 1, wherein said heating resistance element has terminal plates passing through said insulating member and extending to the outside thereof at suitable spacing in the vertical axial direction of said insulating member.

3. The thermal processing furnace according to claim 1, wherein protuberant portions are formed in one surface of a tip portion of each of said supporting means, facing in a peripheral direction of said insulating member.

4. The thermal processing furnace according to claim 1, wherein protuberant portions are formed in two surfaces of a tip portion of each of said supporting means, facing in a peripheral direction of said insulating member.

5. The thermal processing furnace according to claim 1, wherein said supporting means are formed of ceramic.

6. The thermal processing furnace according to claim 1, wherein said insulating member is formed in two layers, a high-density layer and a low-density layer, and a mesh material is interposed between said two layers.

7. The thermal processing furnace according to claim 1, wherein said each of said support members has a comb shape with said support pieces representing teeth of the comb shape support members, and each of said support members supports said heating resistance element on a base portion side of the comb teeth thereof, and a clearance gap is provided between said inner wall surface of said insulating member and said heating resistance element in the radial direction of said furnace.

8. The thermal processing furnace according to claim 7, wherein the lengths of adjacent of said teeth of said comb shape are different.

9. A method of fabricating a thermal processing furnace provided with a helical-shaped heating resistance element along an inner wall surface of a cylindrical insulating member, said method comprising the steps of:

providing a helical-shaped heating resistance element having terminal plates arranged at a suitable spacing in the axial direction on an outer side thereof, with plate surfaces thereof arranged along said axial direction, together with a jig on which is arrayed in the axial direction thereof supporting members formed of a plurality of support pieces that extend in a radially outward direction at a pitch corresponding to that of the heating resistance element from base portions that are positioned on the inner side of said heating resistance element, such that said supporting members are positioned at predetermined positions in the peripheral direction of said heating resistance element, then winding said heating resistance element onto said jig with said support members therebetween;

arranging filter members around the outer periphery of said heating resistance element, avoiding said terminal plates and said support pieces of said supporting means, then arranging spacing members which extend along the axial direction of said heating resistance element, over said filter members, at a suitable spacing in the peripheral direction;

immersing said heating resistance element in a suspension comprising inorganic fibers that are to form an insulating material, and causing said insulating material to accrete on said filter members by the application of suction from the inner side of said heating resistance element;

drying said insulating material accreted on said filter members to form an insulating member;

removing said spacing members in the axial direction from between said dried insulating member and said filter members, then removing said filter members from between said insulating member and said heating resistance element; and removing said jig from said supporting means.

10. The method of fabricating a thermal processing furnace according to claim 9, wherein said suspension comprises inorganic fibers such as silica, alumina, or aluminum silicate fibers mixed with water and a binder.

11. The thermal process furnace of claim 1 wherein said tip portions include a protuberant portion embedded in said insulating member 12. The thermal process furnace of claim 1 wherein said plurality of support pieces extend off from a unitary base portion and are parallel with each other to form a comb-shape.

13. The thermal process furnace of claim 12 wherein said support pieces include a first set of support pieces of a first length and a second set of support pieces of a longer length than that in said first set, and said support pieces of said second set being interposed between support pieces of said first set.

14. A thermal processing furnace, comprising:

an insulating member with an inner wall;

a helical shaped heating resistance element positioned internally of said inner wall;

a support assembly which is comprised of a plurality of support member groups, with each support member group extending in an axial direction of said insulating member, said support member groups being spaced from each other along the periphery of the inner wall of said insulating member, and each support member group being comprised of a plurality of support members with each of said support members including a common base and a plurality of support pieces extending off from said common base, said support pieces having a free end such that each of said support members is comb shaped with a plurality of open slots defined between said support pieces, and said free ends of said support members being embedded in said insulating member so as to retain said support members in a fixed position with respect to said insulating member with the support pieces being arranged at a pitch corresponding to that of the heating resistance element and so as to form heating element reception spaces which are each defined by the inner wall of said insulating member, side edges of non-embedded portions of said support pieces and said common base, and said heating resistance element extending through said reception spaces such that said heating resistance element is supported by said support assembly.

15. The thermal process furnace of claim 14 wherein said reception spaces are radially elongated such that a clearance gap is maintained between the helical shaped heating resistance element and the inner wall of said insulating member.

16. The method of fabricating according to claim 9 wherein during winding said heating resistance element onto said jig said jig is rotated.

17. The method of fabricating according to claim 9 wherein said spacing members are cylindrical shaped rod members.

18. The method of fabricating according to claim 17 wherein said rod members have a diameter of between 1 to 2 mm.

19. The method of fabricating according to claim 9 further comprising varying density of the suspension so as to form layers of said insulating member of different density.

20. The method of fabricating according to claim 9 wherein said jig is rotated during the application of suction.

* * * * *